(12) United States Patent
Cheng et al.

(10) Patent No.: US 7,737,482 B2
(45) Date of Patent: Jun. 15, 2010

(54) SELF-ALIGNED STRAP FOR EMBEDDED TRENCH MEMORY ON HYBRID ORIENTATION SUBSTRATE

(75) Inventors: Kangguo Cheng, Beacon, NY (US); Ramachandra Divakaruni, Ossining, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 500 days.

(21) Appl. No.: 11/538,982

(22) Filed: Oct. 5, 2006

(65) Prior Publication Data
US 2008/0083941 A1   Apr. 10, 2008

(51) Int. Cl.
*H01L 29/76* (2006.01)
(52) U.S. Cl. .................. 257/301; 257/296; 257/347; 257/401

(58) Field of Classification Search .............. 257/296, 257/301, 347, 401
See application file for complete search history.

(56) References Cited
U.S. PATENT DOCUMENTS
2007/0057302 A1* 3/2007 Ho et al. ................. 257/301
* cited by examiner

*Primary Examiner*—Edward Wojciechowicz
(74) *Attorney, Agent, or Firm*—Joseph Petrokaitis; Hoffman Warnick LLC

(57) ABSTRACT

Structures including a self-aligned strap for embedded trench memory (e.g., trench capacitor) on hybrid orientation technology (HOT) substrate, and related method, are disclosed. One structure includes a hybrid orientation substrate including a semiconductor-on-insulator (SOI) section and a bulk semiconductor section; a transistor over the SOI section; a trench capacitor in the bulk semiconductor section; and a self-aligned strap extending from a source/drain region of the transistor to an electrode of the trench capacitor. The method does not require additional masks to generate the strap, results in a self-aligned strap and improved device performance. In one embodiment, the strap is a silicide strap.

15 Claims, 4 Drawing Sheets

SELF-ALIGNED STRAP FOR EMBEDDED TRENCH MEMORY ON HYBRID ORIENTATION SUBSTRATE

BACKGROUND OF THE INVENTION

1. Technical Field

The invention relates generally to semiconductor memory fabrication, and more particularly, to a self-aligned strap for embedded trench memory, e.g., a trench capacitor, on a hybrid orientation technology (HOT) substrate and related method.

2. Background Art

As technologies become increasingly complex, demand for integrated circuits (IC) having more functionality is growing. In order to provide ICs with optimum designs, high-performance complementary metal-oxide semiconductor (CMOS) devices are required with additional features such as embedded memory devices like dynamic random access memory (DRAM). A challenge that arises relative to providing all of these features is that each feature is optimized under different conditions. For example, high-performance CMOS devices may be completed on silicon on insulator (SOI) wafers but memory devices may be built in bulk silicon.

Conventional techniques exist for making patterned SOI (part bulk and part SOI) wafers for the purposes of merging the best of "bulk technologies" with the best of "SOI technologies." One such technique that utilizes this approach integrates DRAM in SOI. In this case, the DRAM array blocks are built in bulk silicon and logic is built in the SOI. The use of SOI and bulk silicon allows for different crystalline orientations on a surface of the substrate. This process technology is referred to as hybrid (surface) orientation technology (HOT).

One challenge relative to HOT technology and embedded memory is efficiently generating a low resistance strap to electrically couple a source/drain region of a transistor on the SOI substrate to an electrode of the embedded memory (e.g., trench capacitor) in the bulk silicon. In particular, conventional techniques require extra masks and cannot generate the strap in a self-aligned manner. Accordingly, the conventional techniques present a complex and costly approach.

SUMMARY OF THE INVENTION

Structures including a self-aligned strap for embedded trench memory (e.g., trench capacitor) on hybrid orientation technology (HOT) substrate, and related method, are disclosed. One structure includes a hybrid orientation substrate including a semiconductor-on-insulator (SOI) section and a bulk semiconductor section; a transistor over the SOI section; a trench capacitor in the bulk semiconductor section; and a self-aligned strap extending from a source/drain region of the transistor to an electrode of the trench capacitor. The method does not require additional masks to generate the strap, results in a self-aligned strap and improved device performance. In one embodiment, the strap is a silicide strap.

A first aspect of the invention provides a structure comprising: a hybrid orientation substrate including a semiconductor-on-insulator (SOI) section and a bulk semiconductor section; a transistor over the SOI section; a trench capacitor in the bulk semiconductor section; and a self-aligned strap extending from a source/drain region of the transistor to an electrode of the trench capacitor.

A second aspect of the invention provides a method comprising: providing a hybrid orientation substrate including a semiconductor-on-insulator (SOI) section and a bulk semiconductor section; forming a trench across an interface between the SOI section and the bulk semiconductor section, the trench stopping on a buried insulator of the SOI section and extending into the bulk semiconductor section; depositing a node dielectric and a first conducting portion in the trench to form a trench capacitor in the trench; recessing the trench capacitor; forming a second conducting portion adjacent to a semiconductor layer of the SOI section; forming a trench isolation over the trench capacitor and the second conducting portion; forming a transistor on the SOI section by which a portion of the trench isolation is removed over the second conducting portion adjacent to the semiconductor layer; and forming a self-aligned strap between the transistor and the trench capacitor.

A third aspect of the invention provides a structure comprising: a hybrid orientation substrate including a semiconductor-on-insulator (SOI) section and a bulk semiconductor section; a transistor over the SOI section; a trench capacitor in the bulk semiconductor section, the trench capacitor including a first portion in the bulk semiconductor and a second portion extending from the first portion over a portion of a buried insulator of the SOI section; and a self-aligned strap extending from a source/drain region of the transistor to an electrode of the trench capacitor, the self-aligned strap including at least a portion of the second portion.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
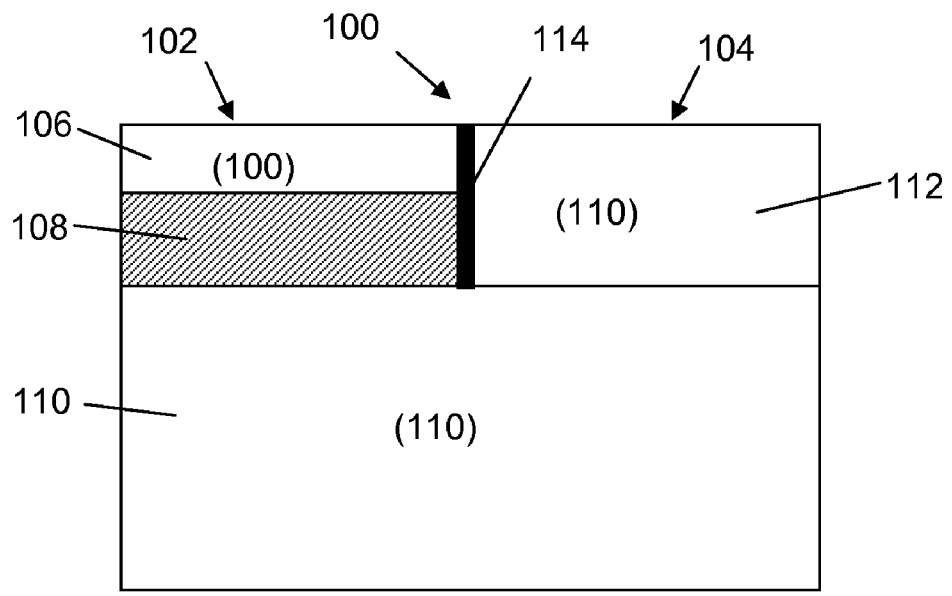
FIGS. 1-8 show one embodiment of a method of forming a self-aligned strap on a hybrid orientation technology (HOT) substrate according to the invention, with FIG. 8 showing a structure including the self-aligned strap according to one embodiment of the invention.

Turning to the drawings, FIGS. 1-8 show one embodiment of a method of forming a self-aligned strap 180 (FIG. 8) on a hybrid orientation technology (HOT) substrate 100 (hereinafter "hybrid orientation substrate") according to the invention. As used herein, "orientation" refers to the crystallographic structure or periodic arrangement of silicon atoms on the surface of a wafer. FIG. 1 shows providing a hybrid orientation substrate 100 including a semiconductor-on-insulator (SOI) section 102 and a bulk semiconductor section 104. SOI section 102 may include a semiconductor layer 106 (e.g., silicon) and a buried insulator layer 108 (e.g., silicon oxide) atop semiconductor substrate 110 (e.g., silicon), from which bulk semiconductor section 104 extends. Bulk semiconductor section 104 includes a semiconductor layer 112 atop semiconductor substrate 110. As indicated, semiconductor layer 106 of SOI section 102 has a different orientation, e.g., (100), than bulk semiconductor section 104, e.g., (110). Other orientations may also be employed. Hybrid orientation substrate 100 can be generated in any now known or later developed fashion. For example, SOI section 102 may be provided, and semiconductor layer 104 and buried insulator layer 106 etched away, and semiconductor layer 112 epitaxially grown from semiconductor substrate 110. SOI section 102 and bulk section 104 may be separated by an interface layer 114 (e.g., silicon oxide or silicon nitride).

"Semiconductor" as used herein may include silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. For example, SOI layer 106 and/or semiconductor layer 112 may be strained.

Figure 2:
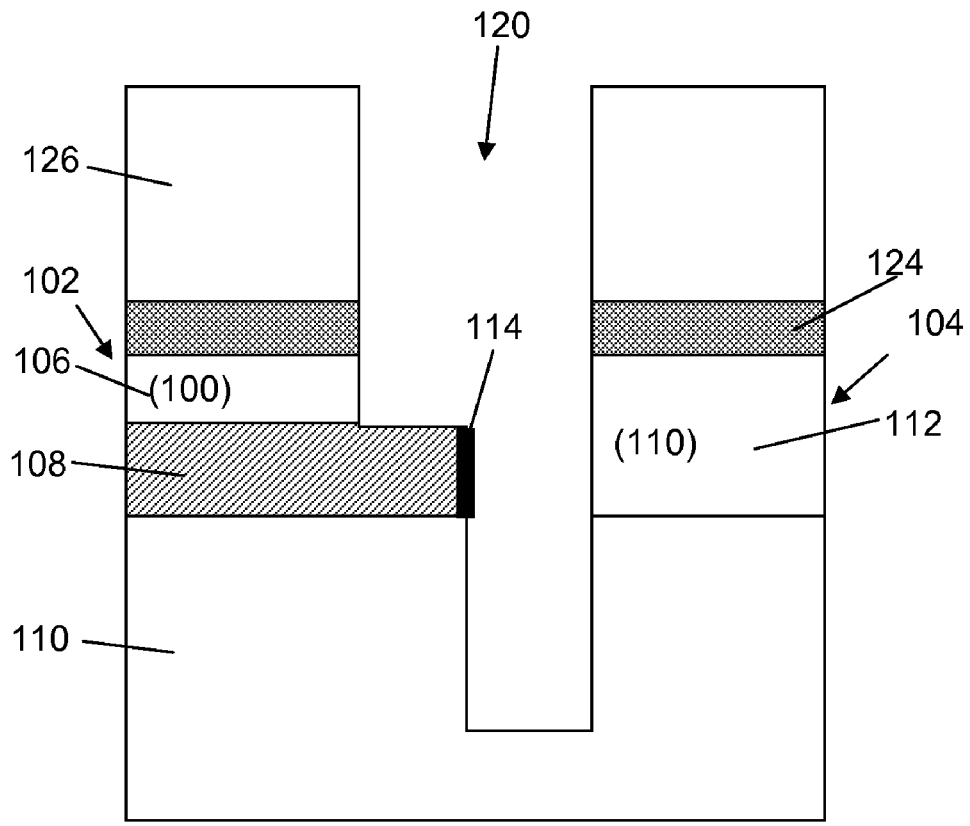

As shown in FIG. 2, a trench 120 is formed across interface 114 between SOI section 102 and bulk semiconductor section 104. Trench 120 may be formed in any now known or later developed manner. For example, as shown, a pad layer 124 (e.g., of silicon oxide and/or silicon nitride) is formed (e.g., deposited), a hardmask 126 (e.g., boro-silicate glass) is deposited, patterned and etched to a surface (not shown) of SOI section 102 and bulk semiconductor section 104. Further etching is then performed to open trench 120. Trench 120 stops on buried insulator 108 after removal of silicon layer 106 of SOI section 102, but extends into bulk semiconductor section 104 (including into semiconductor substrate 110). Hardmask 126 is then removed in any now known or later developed manner, e.g., a reactive ion etch (RIE). As used herein, "depositing" may include any now known or later developed techniques appropriate for the material to be deposited, e.g., chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), sputtering deposition, ion beam deposition, electron beam deposition, laser assisted deposition, thermal oxidation, thermal nitridation, spin-on methods, physical vapor deposition (PVD) or atomic layer deposition (ALD). A portion of interface layer 114 above buried insulator layer 108 may be removed during the process of etching trench 120.

Figure 3:
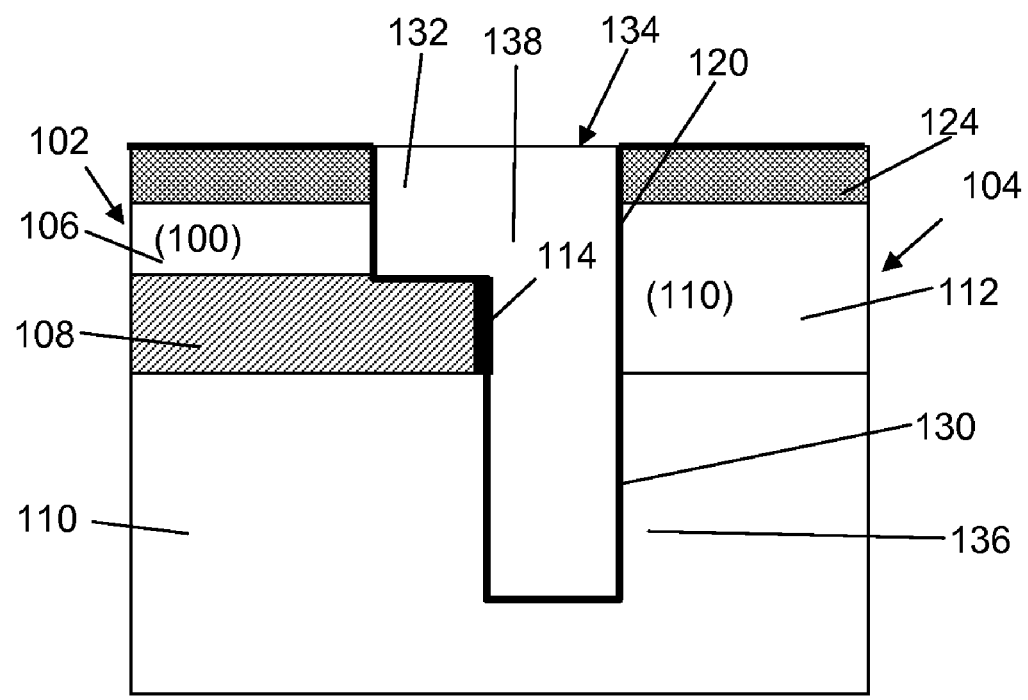

FIG. 3 shows depositing a node dielectric 130 and a first conducting portion 132 of conducting material in trench 120 to form a trench capacitor 134 in trench 120. Node dielectric 130 may include any now known or later developed insulator appropriate for forming a trench capacitor 134, e.g., silicon oxide, silicon nitride, silicon oxynitride, high-k material having a relative permittivity above about 10, or any combination of these materials. Examples of high-k material include but are not limited to metal oxides such as $Ta_2O_5$, $BaTiO_3$, $HfO_2$, $ZrO_2$, $Al_2O_3$, or metal silicates such as $Hf_{A1}Si_{A2}O_{A3}$ or $Hf_{A1}Si_{A2}O_{A3}N_{A4}$, where A1, A2, A3, and A4 represent relative proportions, each greater than or equal to zero and A1+A2+A3+A4 (1 being the total relative mole quantity). First conducting portion 132 may include, for example, amorphous silicon, polycrystalline silicon (hereinafter "polysilicon"), germanium, silicon germanium, a metal (e.g., tungsten, titanium, tantalum, ruthenium, cobalt, copper, aluminum), a conducting metallic compound material (e.g., tungsten silicide, tungsten nitride, titanium nitride, tantalum nitride, ruthenium oxide, cobalt silicide, nickel silicide), or any suitable combination of these materials. First conducting portion 132 may further include dopants. In one embodiment, first conducting portion 132 includes doped polysilicon. Methods for forming the node dielectric 130 and first conducting portion 132 include but are not limited to thermal oxidation, chemical oxidation, thermal nitridation, atomic layer deposition (ALD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), limited reaction processing chemical vapor deposition (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, ion beam deposition, electron beam deposition and/or laser assisted deposition.

As known in the art, trench capacitor 134 includes an electrode 136 within silicon substrate 110 separated by node dielectric 130 from another electrode 138 formed by first conducting portion 132 inside trench 120. Part or entire semiconductor substrate 110 may be doped and therefore electrode 136 may be placed in a doped region. Planarization (e.g., chemical mechanical polishing (CMP)) may be conducted at this point after depositing first conducting portion 132.

Figure 4:
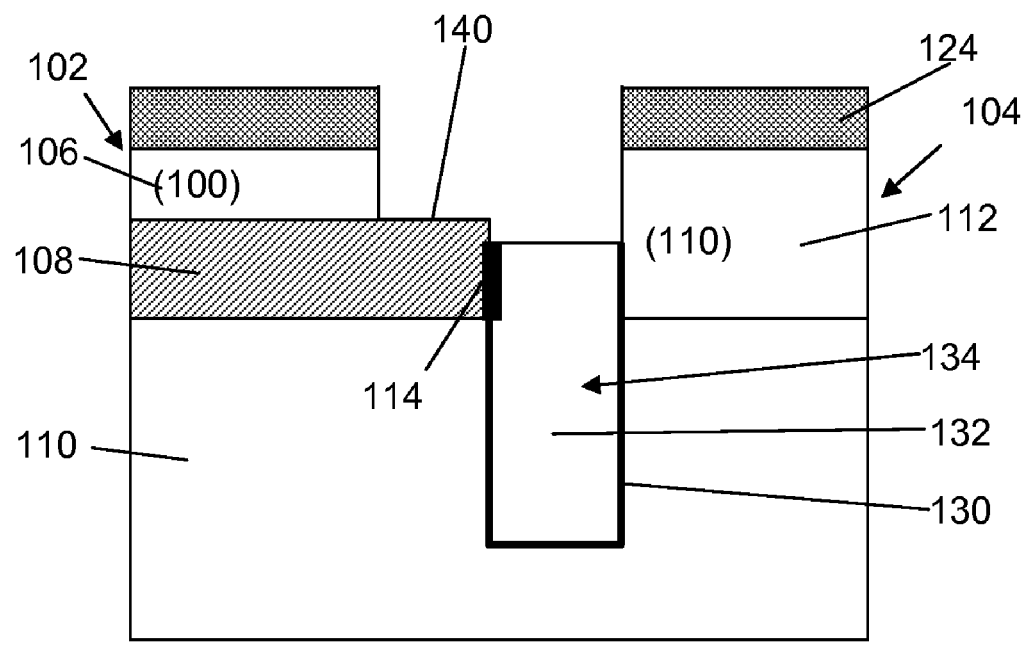

FIG. 4 shows recessing trench capacitor 134, which may include etching first conducting portion 132 and removing any exposed node dielectric 130. Trench capacitor 134 is shown recessed to just below a surface 140 of buried insulator layer 108; however, it may be at other locations relative to surface 140, e.g., higher or lower.

Figure 5:
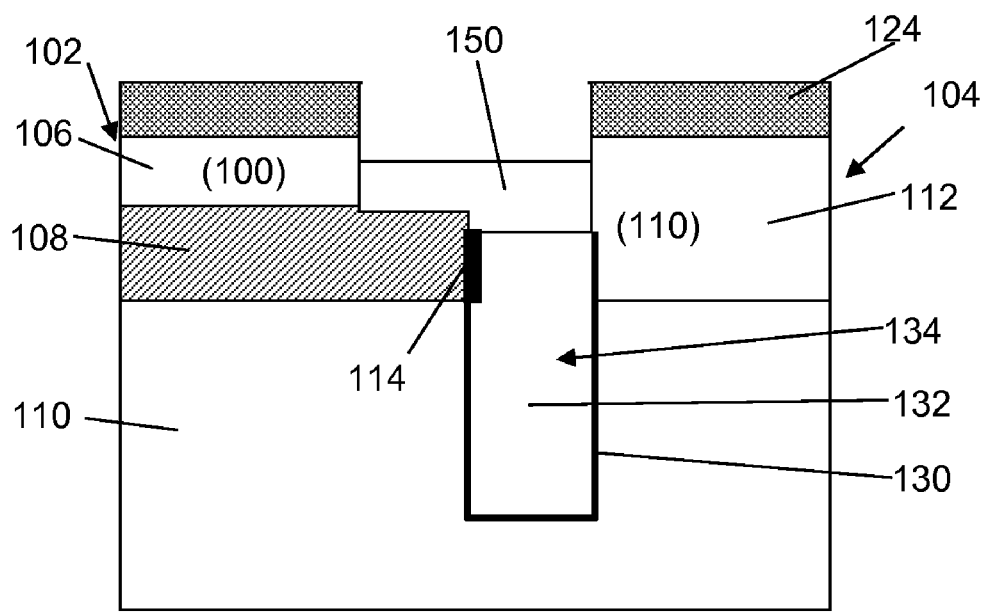
Figure 6:
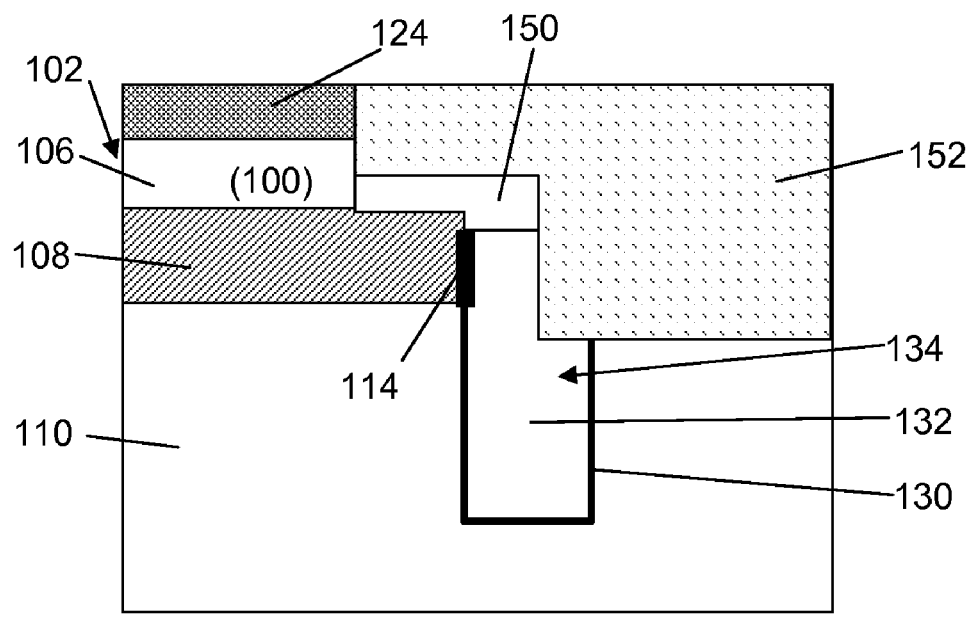

FIG. 5 shows forming a second conducting portion 150 of conducting material adjacent to silicon layer 106 of SOI section 102. Second conducting portion 150 may include, for example, amorphous silicon, polycrystalline silicon (polysilicon hereinafter), germanium, silicon germanium, a metal (e.g., tungsten, titanium, tantalum, ruthenium, cobalt, copper, aluminum), a conducting metallic compound material (e.g., tungsten silicide, tungsten nitride, titanium nitride, tantalum nitride, ruthenium oxide, cobalt silicide, nickel silicide), or any suitable combination of these materials. Second conducting portion 150 may extend over first conducting portion 132 to silicon layer 106. Trench capacitor 134 now includes first conducting portion 132 and second conducting portion 150, as is described in greater detail herein. FIG. 6 shows forming a trench isolation 152 over trench capacitor 134, including second conducting portion 150. Trench isolation 152 may be formed using any technique, e.g., etching and then depositing a dielectric such as silicon oxide.

Figure 7:
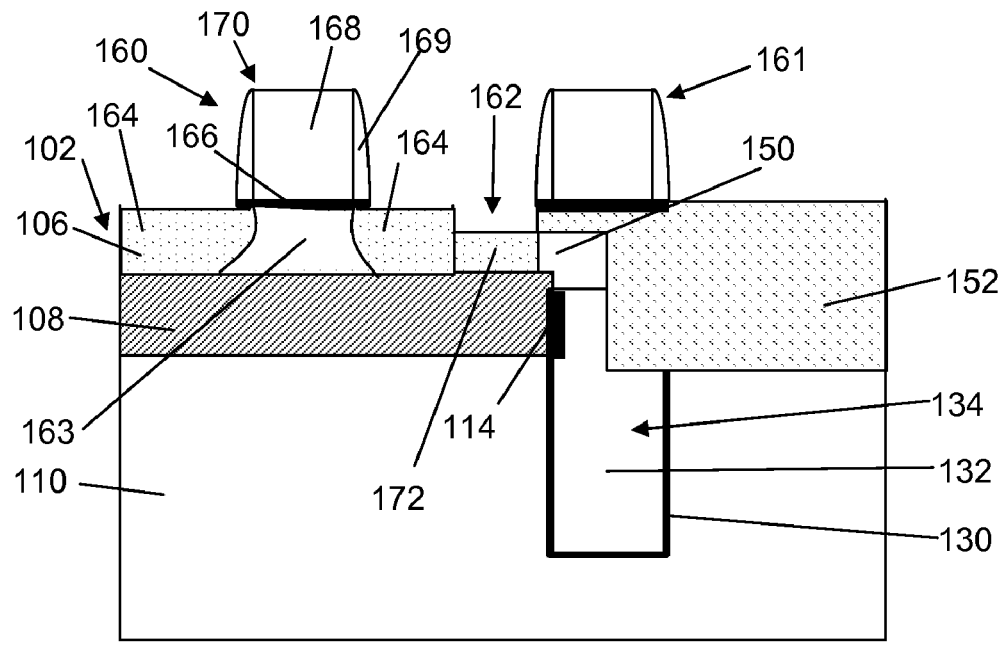

FIG. 7 shows forming a transistor 160 on SOI section 102. A passive transistor 161 also may be formed at this point on isolation region 152 over trench capacitor 134. Passive transistor 161 may be advantageous in self-alignment of strap 180 (FIG. 8), but may not be necessary in all instances, e.g., trench isolation 152 and/or other materials may be used for self-alignment purposes. Each transistor 160, 161 may be formed using any now known or later developed techniques. For example, pad layer 124 (FIG. 6) may be removed (e.g., by etching or polishing), ion implantation may be performed to incorporate dopants (not shown) into a channel region 163 in semiconductor layer 106, a gate dielectric layer 166 (e.g., hafnium silicate, hafnium oxide, zirconium silicate, zirconium oxide, silicon oxide, silicon nitride, silicon oxynitride, high-k material or any combination of these materials) may be deposited, a gate conductor layer 168 (e.g., polysilicon, metal or alloys thereof) may be deposited, and a gate 170 may be patterned and etched from gate dielectric layer 166 and gate conductor layer 168. Spacer(s) 169 may be added as known in the art. It is during this later etching that portion 162 of trench isolation 152 is removed adjacent to silicon layer 106 to expose at least a portion of the top surface of second conducting portion 150. Source/drain 164 then may be formed in silicon layer 106 adjacent to gate 170 by ion implantation. During the ion implantation process, dopants are also implanted into the exposed portion of second conducting portion 150, forming a self-aligned doped strap 172 in second conducting portion 150. One terminal of source/drain 164 is electrically connected to remaining portion of second conducting portion 150 through doped strap 172. Note that transistor 161 does not include a source/drain region since it is formed on trench isolation 152.

Figure 8:
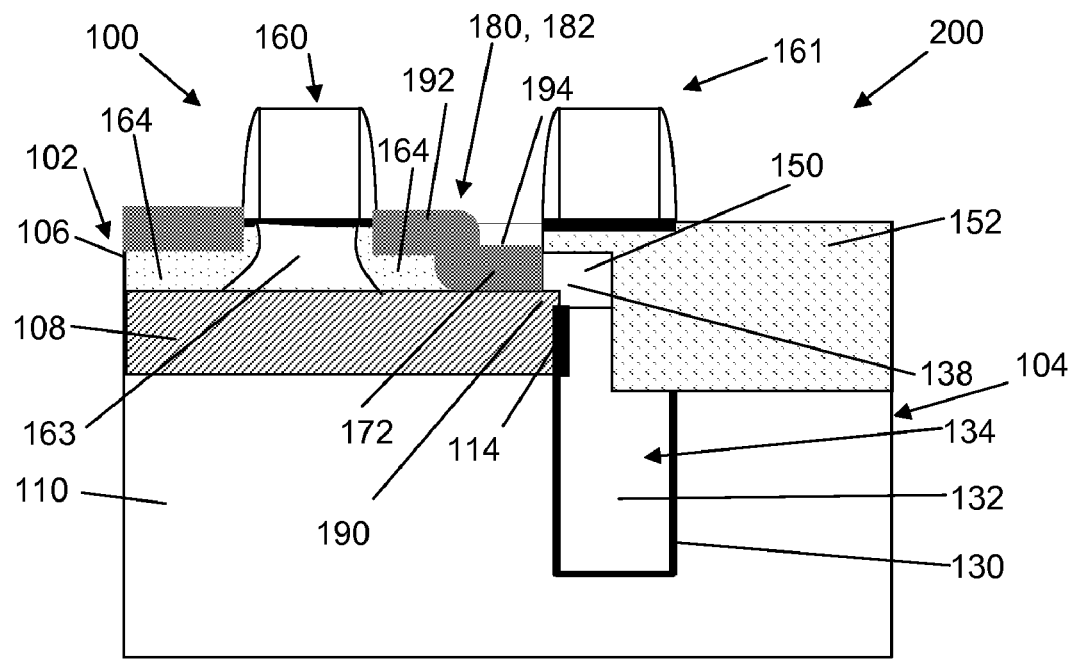

FIG. 8 shows forming a self-aligned strap 180 between transistor 160 and trench capacitor 134. In one embodiment, the forming includes simultaneously forming silicide 182 in semiconductor layer 106 and at least a portion of doped strap 172, i.e., in second conducting portion 150. Silicide 182, including but not limited to titanium silicide, nickel silicide, and cobalt silicide, may be formed using any now known or later developed technique, e.g., depositing a metal such as titanium, nickel, cobalt, annealing to have the metal reacts with silicon, and removing unreacted metal. Silicide 182 is formed in silicon layer 106 and doped strap 172, e.g. of polysilicon, generating a silicide strap 180. Strap 180 is thus self-aligned to trench capacitor 134 (and transistor 161, where used) and transistor 160. In another embodiment, the forming includes simultaneously incorporating dopants into semiconductor layer 106 and at least a portion of second conducting portion 150, e.g., by simply forming source/drain region 164 and doped strap 172. In this case, self-aligned strap 180 includes dopants.

FIG. 8 also shows one embodiment of a structure 200 according to the invention. Structure 200 includes hybrid orientation substrate 100 including SOI section 102 and bulk semiconductor section 104, transistor 160 over SOI section 102, trench capacitor 134 in bulk semiconductor section 104, self-aligned silicide strap 180 extending from source/drain region 164 of transistor 160 to electrode 138 of trench capacitor 134. Trench capacitor 134 includes first conducting portion 132 in bulk semiconductor section 104 and second conducting portion 150. Second conducting portion 150 may extend from first conducting portion 132 and have a portion thereof extend over a portion 190 of buried insulator 108 of SOI section 102. Self-aligned silicide strap 180 includes at least a portion of second conducting portion 150. As shown in FIG. 8, a surface 192 of silicide strap 180 in source/drain region 164 may be non-planar with a surface 194 of suicide strap adjacent to trench capacitor 134. Trench isolation 152 isolates trench capacitor 134 from other structure (not shown). As noted above, trench isolation 152 may include passive transistor 161 thereover such that strap 180 is self-aligned between transistor 160 and passive transistor 161. Trench isolation 152 may extend over trench capacitor 134.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A structure comprising:
a hybrid orientation substrate including a semiconductor-on-insulator (SOI) section co-planar at a top surface of the substrate with a bulk semiconductor section;
a transistor over the SOI section;
a trench capacitor in the bulk semiconductor section; and
a self-aligned strap extending from a source/drain region of the transistor to an electrode of the trench capacitor.

2. The structure of claim 1, wherein the trench capacitor includes a first conducting portion in the bulk semiconductor section and a second conducting portion extending from the first conducting portion over a portion of a buried insulator of the SOI section, and wherein a portion of the self-aligned strap that extends to the trench capacitor and is in the bulk semiconductor section includes at least a portion of the second conducting portion.

3. The structure of claim 2, wherein a surface of the self-aligned strap in a source/drain region of the transistor is non-planar with a surface of the self-aligned strap adjacent to the trench capacitor.

4. The structure of claim 1, wherein the self aligned strap includes dopants.

5. The structure of claim 1, wherein the self-aligned strap includes silicide.

6. The structure of claim 1, further comprising:
a trench isolation isolating the trench capacitor from other structure; and
a passive transistor over the trench isolation;
wherein the self-aligned strap is self-aligned between the transistor and the passive transistor.

7. The structure of claim 1, wherein each semiconductor section includes silicon.

8. A structure comprising:
a hybrid orientation substrate including a semiconductor-on-insulator (SOI) section co-planar at a top surface of the substrate with a bulk semiconductor section;
a transistor over the SOI section;
a trench capacitor in the bulk semiconductor section, the trench capacitor including a first portion in the bulk semiconductor and a second portion extending from the first portion over a portion of a buried insulator of the SOI section; and
a self-aligned strap extending from a source/drain region of the transistor to an electrode of the trench capacitor, a portion of the self-aligned strap that extends to the trench capacitor and is in the bulk semiconductor section includes at least a portion of the second portion.

9. The structure of claim 8, wherein the first portion and the second portion of the trench capacitor include a polysilicon.

10. The structure of claim 8, wherein a surface of the strap in the source/drain region is non-planar with a surface of the strap adjacent to the trench capacitor.

11. The structure of claim 8, wherein at least a portion of the strap includes silicide.

12. The structure of claim 8, wherein a doped portion of the second portion of the trench capacitor includes implanted dopants, and wherein at least a portion of the strap includes the doped portion of the second portion of the trench capacitor.

13. The structure of claim 8, further comprising a trench isolation extending over the trench capacitor isolating the trench capacitor from other structure and a passive transistor over the trench isolation.

14. The structure of claim 13, wherein the self-aligned strap is self-aligned between the transistor and the passive transistor.

15. The structure of claim 13, wherein the trench isolation extends over the trench capacitor.

* * * * *